US007586320B2

United States Patent
Wu et al.

(10) Patent No.: US 7,586,320 B2
(45) Date of Patent: Sep. 8, 2009

(54) PLUNGER AND CHIP-TESTING MODULE APPLYING THE SAME

(75) Inventors: Hsin-Kuan Wu, Hsin-Tien (TW); Hsing-Chou Hsu, Hsin-Tien (TW)

(73) Assignee: VIA Technologies, Inc., Taipei Hsien (TW)

( * ) Notice: Subject to any disclaimer, the term of this patent is extended or adjusted under 35 U.S.C. 154(b) by 169 days.

(21) Appl. No.: 11/484,268

(22) Filed: Jul. 10, 2006

(65) Prior Publication Data

US 2007/0200583 A1     Aug. 30, 2007

(30) Foreign Application Priority Data

Feb. 15, 2006    (TW) .............................. 95105013 A

(51) Int. Cl.
*G01R 31/02*    (2006.01)
*G01R 31/28*    (2006.01)
(52) U.S. Cl. ..................................... 324/761
(58) Field of Classification Search ............. 324/158.1, 324/760–765, 715, 724; 29/842; 257/419, 257/432, 443
See application file for complete search history.

(56) References Cited

U.S. PATENT DOCUMENTS

| 6,512,389 | B1 * | 1/2003 | Kocher ........................ 324/755 |
| 6,812,055 | B2 * | 11/2004 | Tamura et al. ................. 438/48 |
| 7,380,322 | B2 * | 6/2008 | von Detten ................. 29/33 M |
| 7,403,025 | B2 * | 7/2008 | Tervo et al. .................. 324/754 |

* cited by examiner

*Primary Examiner*—Ha Tran T Nguyen
*Assistant Examiner*—Trung Q Nguyen
(74) *Attorney, Agent, or Firm*—J.C. Patents

(57) ABSTRACT

A plunger is suitable for a chip-testing module having a probe card, which has a circuit board and a membrane. The membrane has a circuit layer disposed on a first membrane surface of the membrane, conductive through-vias penetrating the membrane, and bumps disposed on a second membrane surface opposite to the first membrane surface, located in a pushed area of the membrane, and electrically connected to the circuit layer through the conductive through-vias. The plunger includes a body having a pushing part and a base part and a conductive layer disposed on a surface of the pushing part and the base part. Part of the circuit layer located in the pushed area is suitable for contacting and being electrically connected to part of the conductive layer located on the pushing part. The bumps are electrically connected to the conductive layer through the conductive through-vias.

7 Claims, 4 Drawing Sheets

PLUNGER AND CHIP-TESTING MODULE APPLYING THE SAME

CROSS-REFERENCE TO RELATED APPLICATION

This application claims the priority benefit of Taiwan application serial no. 95105013, filed on Feb. 15, 2006. All disclosure of the Taiwan application is incorporated herein by reference.

BACKGROUND OF THE INVENTION

1. Field of Invention

The present invention relates to a testing device and a testing module, and more particularly to a plunger and a chip-testing module applying the same.

2. Description of Related Art

Testing for integrated circuit chips (IC chips) is necessary at different stages of the semiconductor process. Each IC chip in the wafer configuration and package configuration must be tested to ensure its electrical function. Along with the enhancement and complication of chip functions, the requirements for high-speed and precise testing become more and more important.

The process of testing individual chips in the wafer configuration, called wafer sorting, includes establishing a temporary electrical contact between a chip and an automatic testing apparatus. Wafer sorting is an important test of the design and function of ICs, in order to select good IC chips before chip dicing and subsequent packaging.

Referring to FIG. 1, it shows the schematic sectional view of a conventional chip-testing module. The conventional chip-testing module 100 is suitable for being electrically connected to a tested surface TS of a chip C. The conventional chip-testing module 100 includes a plunger 110 and a probe card 120. The plunger 110 includes a body 112 with a pushing part 112a and a base part 112b.

The probe card 120 includes a circuit board 122 and a membrane 124. The circuit board 122 has an opening 122a. The pushing part 112a of the body 112 penetrates the circuit board 122 through the opening 122a. The membrane 124 has a plurality of circuit layers 124a overlapping one another and a plurality of bumps 124b. The circuit layers 124a further include a first circuit layer L1 disposed on a first membrane surface 124c of the membrane 124, and the layers 124a also include a second circuit layer L2 disposed on a second membrane surface 124d of the membrane 124 where the second membrane surface 124d is opposite to the first membrane surface 124c. The bumps 124b are disposed on part of a pushed area PA of the second circuit layer L2, where the pushed area PA is located on the membrane 124, to contact the tested surface TS of the chip C.

The membrane 124 further has a plurality of conductive through-vias 124e (only one of which is shown) to electrically connect the circuit layers 124a. The membrane 124 further has a first dielectric layer 124f disposed on the first membrane surface 124c and covering part of the first circuit layer L1 to protect it. The membrane 124 further has a second dielectric layer 124g disposed on the second membrane surface 124d and covering part of the first circuit layer L2 to protect it.

Furthermore, the probe card 120 further includes at least one capacitor 126 disposed on the second membrane surface 124d of the membrane 124. In addition, the above-mentioned first circuit layer L1 includes a power supply circuit or a ground circuit.

The following part illustrates the process of electrically testing the chip C by using the conventional chip-testing module 100. Referring to FIGS. 1 and 2, FIG. 2 shows the schematic sectional view of the chip-testing module in FIG. 1 during performing an electrical test. After the pushed area PA of the membrane 124 is pushed by the pushing part 112a (which penetrates through the opening 122a of the circuit board 122) of the body 112 of the plunger 110 and after a pressed area SA connected to the pushed area PA of the membrane 124 is clamped between the base part 112b and the circuit board 122, the membrane 124, the circuit board 122, and the plunger 110 are fixed together to form the chip-testing module 100. In the testing process, relative displacement occurs between the chip C and the chip-testing module 100. Usually, the chip C moves perpendicularly, so that the bumps 124b of the membrane 124 contact the tested surface TS of the chip C to electrically test the chip C.

However, for the conventional chip-testing module with a membrane of high-density wiring, the connecting path of the first circuit layer is very long, resulting in an increase of its parasitic inductance value. Furthermore, the number of the signal pads on the tested surface of a chip tested by the conventional chip-testing module is limited due to the limited wiring ability of the membrane. Further, when high frequency signals are transmitted, the long connecting path of the first circuit layer increases its insertion loss, thereby reducing its transmission efficiency.

SUMMARY OF THE INVENTION

The present invention provides a plunger suitable for a chip-testing module. The chip-testing module has a probe card with a circuit board and a membrane. The membrane has a circuit layer disposed on a first membrane surface of the membrane, at least one conductive through-via penetrating the membrane, and a plurality of bumps disposed on a second membrane surface opposite to the first membrane surface and located in a pushed area of the membrane. At least one of the bumps is electrically connected to the circuit layer through the conductive through-via. The plunger includes a body having a pushing part and a base part and a conductive layer disposed on a surface of the pushing part and the base part. Part of the circuit layer located in the pushed area is suitable for contacting and being electrically connected to part of the conductive layer located on the pushing part. At least one of the bumps is electrically connected to the conductive layer through the conductive through-via.

The present invention provides a chip-testing module, including a plunger and a probe card. The plunger includes a body having a pushing part and a base part and a conductive layer disposed on a surface of the pushing part and the base part. The probe card includes a circuit board having an opening and a membrane. The pushing part of the body penetrates the circuit board through the opening. The membrane has a first circuit layer disposed on a first membrane surface of the membrane, at least one conductive through-via penetrating the membrane, and a plurality of bumps disposed on a second membrane surface opposite to the first membrane surface and located in a pushed area of the membrane. At least one of the bumps is electrically connected to the first circuit layer through the conductive through-via. Part of the first circuit layer located in the pushed area is contacting and being electrically connected to part of the conductive layer located on the pushing part. At least one of the bumps is electrically connected to the conductive layer through the conductive through-via.

In order to the make the aforementioned features and advantages of the present invention comprehensible, multiple embodiments accompanied with figures are described in detail below.

DESCRIPTION OF EMBODIMENTS

Figure 1:
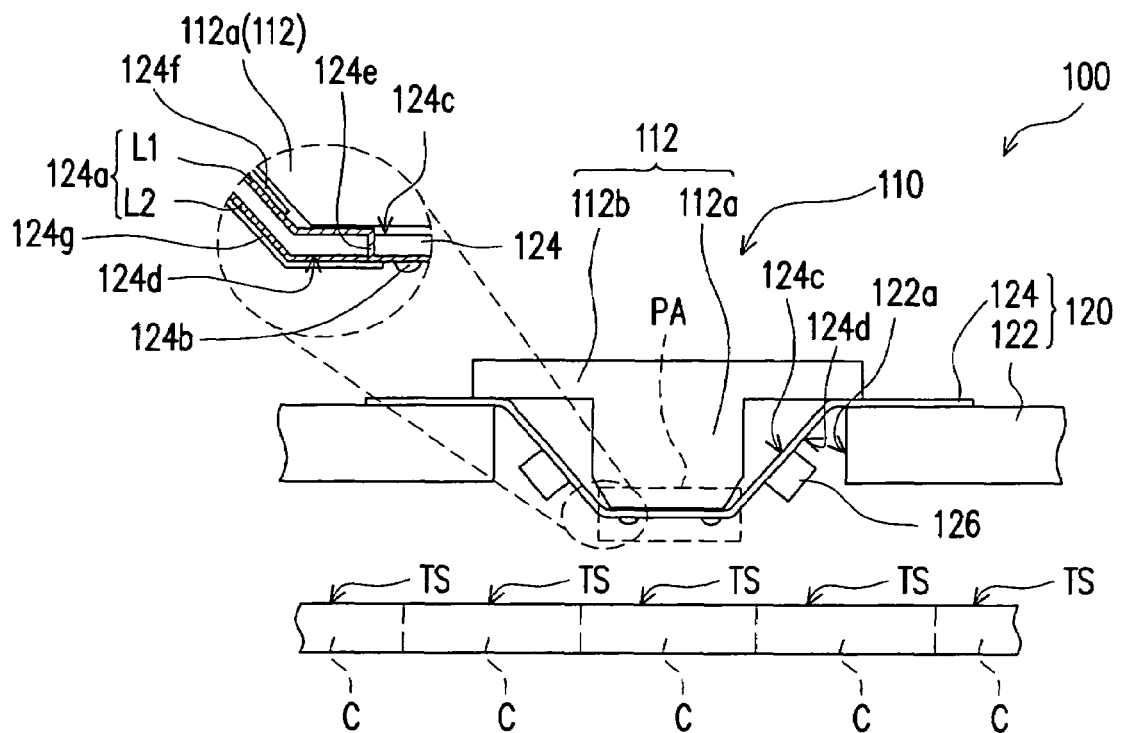
FIG. 1 shows the schematic sectional view of a conventional chip-testing module.
Figure 2:
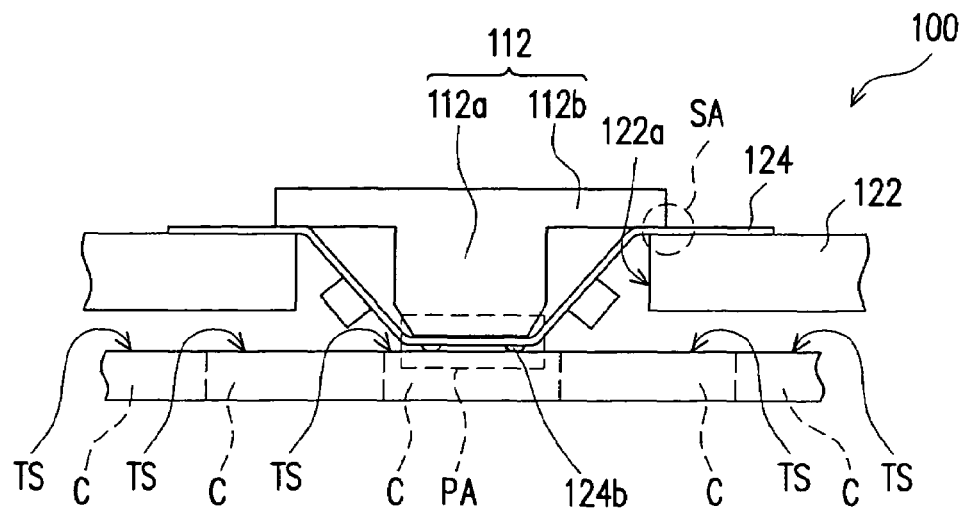
FIG. 2 shows the schematic sectional view of the chip-testing module in FIG. 1 when performing an electrical test.
Figure 3:
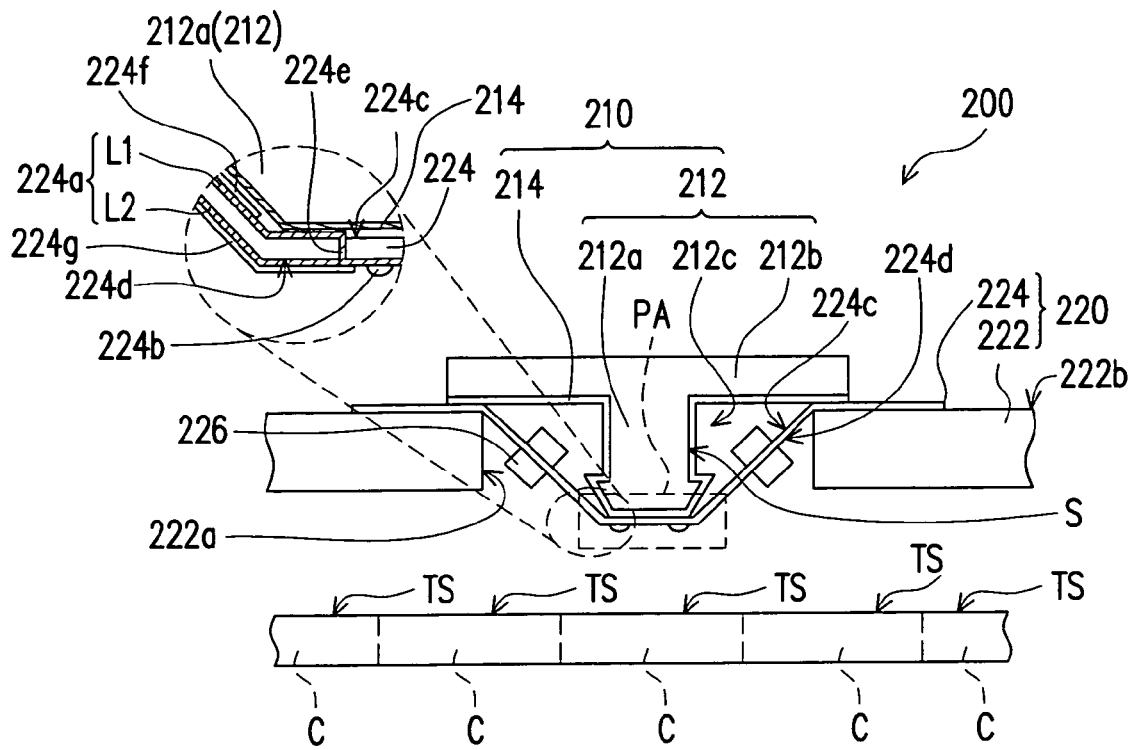
FIG. 3 shows the schematic sectional view of a chip-testing module according to a first embodiment of the present invention.

Referring to FIG. 3, it shows the schematic sectional view of a chip-testing module according to the first embodiment of the present invention. The chip-testing module 200 of the first embodiment is suitable for being electrically connected to a tested surface TS of a chip C. The chip-testing module 200 includes a plunger 210 and a probe card 220. The plunger 210 includes a body 212 having a pushing part 212a and a base part 212b, and the plunger 210 also includes a conductive layer 214 disposed on the surfaces of the pushing part 212a and the base part 212b.

The probe card 220 includes a circuit board 222 having an opening 222a and a membrane 224. The pushing part 212a of the body 212 penetrates the circuit board 222 through the opening 222a. The membrane 224 has a plurality of circuit layers 224a overlapping one another, a plurality of conductive through-vias 224e (only one is shown) penetrating the membrane 224, and a plurality of bumps 224b. The circuit layers 224a further include a first circuit layer L1 disposed on a first membrane surface 224c of the membrane 224, and the layers 224a also include a second circuit layer L2 disposed on a second membrane surface 224d opposite to the first membrane surface 224c of the membrane 224. The bumps 224b are disposed on the second membrane surface 224d and located in a pushed area PA of the membrane 224 to contact the tested surface TS of the chip C. Furthermore, at least one of the bumps 224b is electrically connected to the first circuit layer L1 via the conductive through-via 224e.

In the first embodiment, the membrane 224 further has a first dielectric layer 224f disposed on the first membrane surface 224c and covering part of the first circuit layer L1 to protect it. The membrane 224 further has a second dielectric layer 224g disposed on the second membrane surface 224d and covering part of the second circuit layer L2 to protect it. The probe card 220 further includes at least one capacitor 226 (FIG. 3 shows four capacitors) disposed on the first membrane surface 224c and the second membrane surface 224d of the membrane 224 and located outside of the pushed area PA. The body 212 may further have a pocket 212c located on one side S of the pushing part 212a to accommodate the capacitors 226 disposed on the first membrane surface 224c. Furthermore, in the first embodiment, the first circuit layer L1 includes a power supply circuit or a ground circuit.

Figure 4:
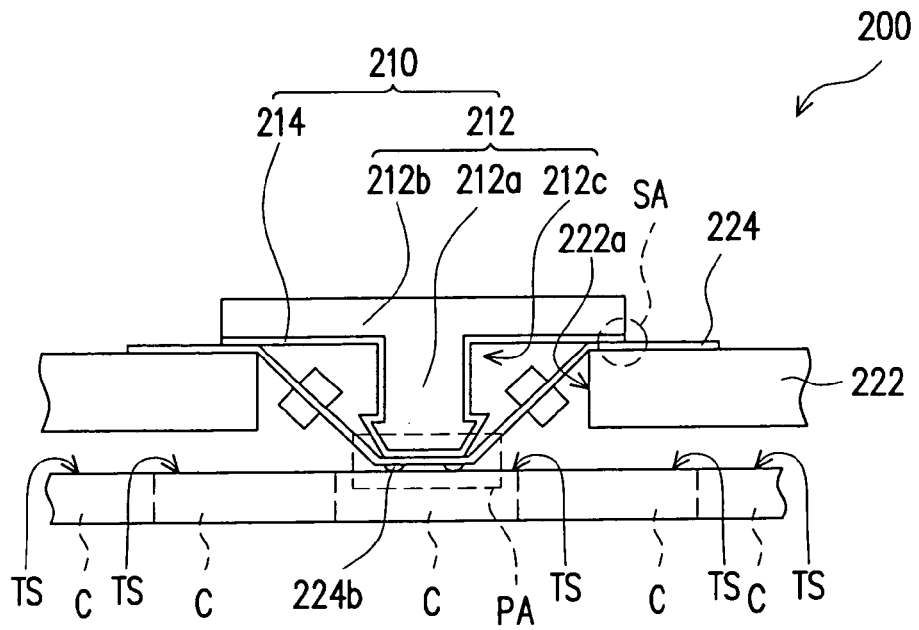
FIG. 4 shows the schematic sectional view of the chip-testing module in FIG. 3 when performing an electrical test.

The following part illustrates the process of electrically testing the chip C by using the chip-testing module 200 of the first embodiment. Referring to FIGS. 3 and 4, FIG. 4 shows the schematic sectional view of the chip-testing module in FIG. 3 when an electrical test is performed. After the pushed area PA of the membrane 224 is pushed by the pushing part 212a (which penetrates through the opening 222a of the circuit board 222) of the body 212 of the plunger 210 and after a pressed area SA connected to the pushed area PA of the membrane 224 is clamped between the base part 212b and the circuit board 222, the membrane 224, circuit board 222, and plunger 210 are fixed together to form the chip-testing module 200.

Therefore, part of the first circuit layer L1 located in the pushed area PA contacts and is electrically connected to part of the conductive layer 214 located on the pushing part 212a. At least one of the bumps 224b is electrically connected to the conductive layer 214 through the conductive through-via 224e. Part of the first circuit layer L1 located in the pressed area SA contacts and is electrically connected to part of the conductive layer 214 located on the base part 212b, and part of the second circuit layer L2 contacts and is electrically connected to the circuit board 222.

In the testing process, relative displacement occurs between the chip C and the chip-testing module 200. Usually, the chip C moves perpendicularly, so that the bumps 224b of the membrane 224 contact the tested surface TS of the chip C to electrically test the chip C. When the first circuit layer L1 includes a power supply circuit or a ground circuit, the return path is increased by simultaneously contacting the circuit board 222 and the conductive layer 214 of the first circuit layer L1. As a result, the parasitic inductance is reduced.

Figure 5:
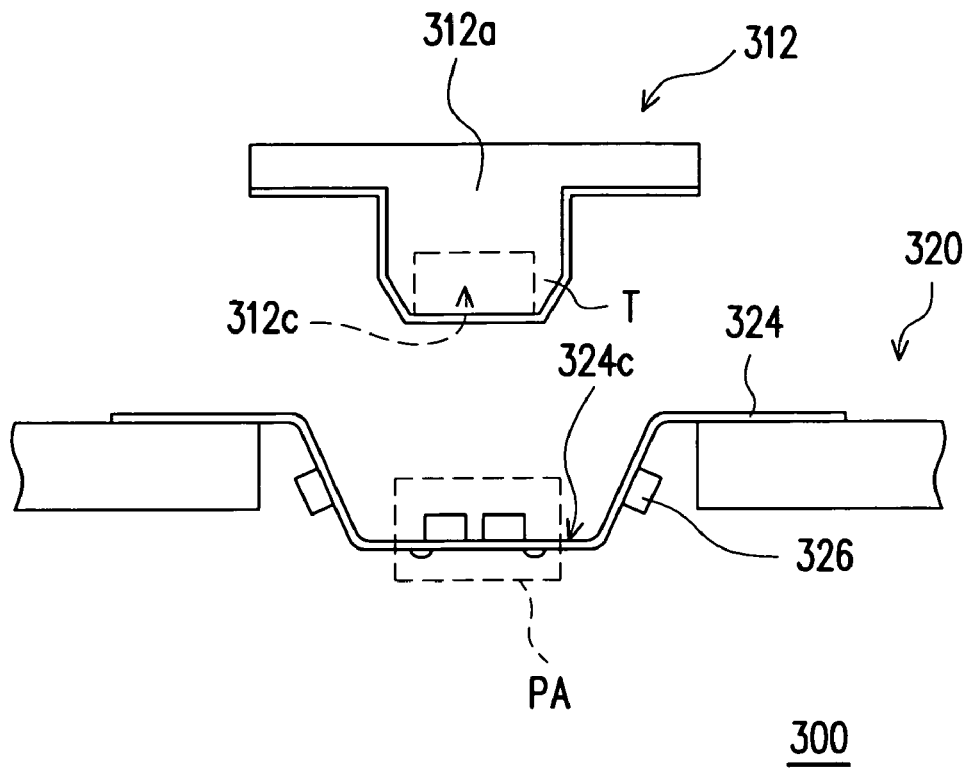
FIG. 5 shows the schematic sectional view of a chip-testing module according to a second embodiment of the present invention.
Figure 6:
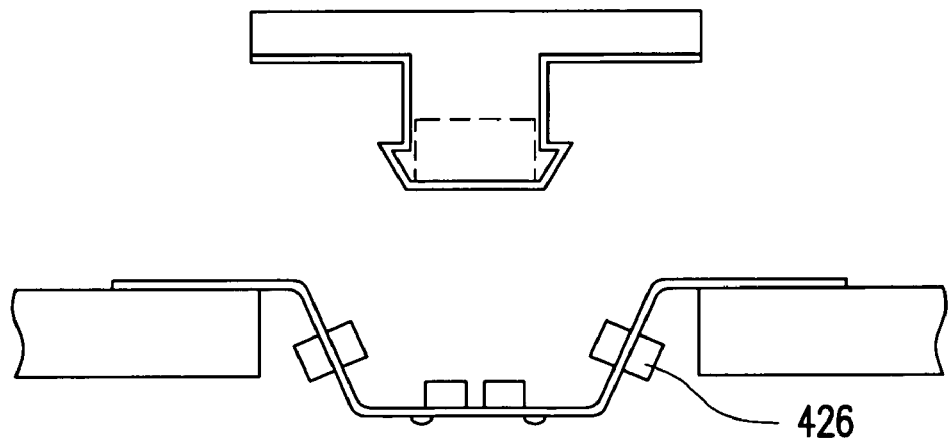
FIG. 6 shows the schematic sectional view of a chip-testing module according to a third embodiment of the present invention.

Referring to FIGS. 5 and 6, the schematic sectional views of a chip-testing module according to the second embodiment and the third embodiment of the present invention are respectively shown. The difference between the second embodiment and the first embodiment is that part of the capacitors 326 included in the probe card 320 of the chip-testing module 300 in the second embodiment may be disposed on the first membrane surface 324c in the pushed area PA of the membrane 324 and that the body 312 may further have a pocket 312c located on a top end T of the pushing part 312a to accommodate the above-mentioned capacitors 326 located in the pushed area PA of the membrane 324. However, the positions where the capacitors 226 are disposed in the first embodiment may be combined with the positions where the capacitors 326 are disposed in the second embodiment. The manner of combination may be seen in the positions where the capacitors 426 are disposed in the chip-testing module 400 of the third embodiment.

Figure 7:
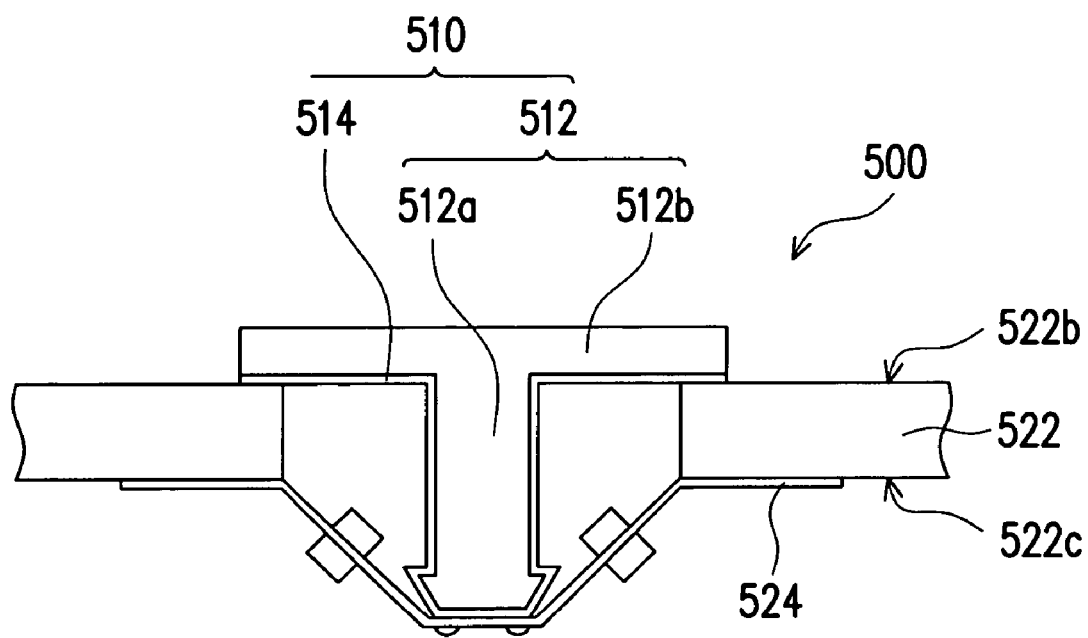
FIG. 7 shows the schematic sectional view of a chip-testing module according to a fourth embodiment of the present invention.

Referring to FIG. 7, it shows the schematic sectional view of a chip-testing module according to the fourth embodiment of the present invention. The difference between the fourth embodiment and the first embodiment is that the membrane 224 of the chip-testing module 200 in the first embodiment is fixed on the first plate surface 222b of the circuit board 222, while the membrane 524 of the chip-testing module 500 in the fourth embodiment is fixed on the second plate surface 522c of the circuit board 522, i.e. part of the first circuit layer (not shown) contacts and is electrically connected to the circuit board 522. Additionally, the base part 512a adjacent to the pushing part 512b of the plunger 510 is directly fixed on the first plate surface 522b of the circuit board 522 without via the membrane 524, and part of the conductive layer 514 located on the base part 512a directly contacts and is electrically connected to a pad (not shown) of the first plate surface 522b of the circuit board 522.

In view of the above, the plunger and the chip-testing module applying the same of the present invention have at least the following advantages:

a. Since a conductive layer is disposed on the surface of the plunger of the present invention, when a chip is electrically tested, the conductive layer contacts the circuit layer of the membrane, thereby increasing the return path and reducing the connecting path of the circuit layer of the membrane, so as to reduce the parasitic inductance value, insertion loss, and crosstalk interference of the circuit layer of the membrane.

b. Since the body of the plunger of the present invention has a pocket for accommodating capacitors, the options of the positions of the capacitors and the number thereof on the membrane are increased.

c. Since the ground circuit of the membrane can provide additional return paths via the conductive layer of the plunger, the flexibility in designing the wiring layout of the membrane is increased to raise the number of the signal pads of the chip to be tested.

Though the present invention has been disclosed above by the embodiments, they are not intended to limit the invention. Anybody skilled in the art may make some modifications and variations without departing from the spirit and scope of the invention. Therefore, the protecting range of the invention falls in the appended claims.

What is claimed is:

1. A plunger for a chip-testing module having a probe card with a circuit board and a membrane, wherein the membrane having a circuit layer disposed on a first surface of the membrane, at least one conductive through-via penetrating the membrane, and a plurality of bumps disposed on a second surface located in a pushed area of the membrane, wherein the second surface is opposite to the first surface, wherein at least one of the bumps is connected to the circuit layer through the conductive through-via, the plunger comprising:

a body having a pushing part and a base part; and a conductive layer disposed directly on a surface of the pushing part and the base part, wherein the circuit layer located in the pushed area is suitable for contacting and being connected to the conductive layer located on the pushing part, and at least one of the bumps is connected to the conductive layer through the conductive through-via.

2. The plunger as claimed in claim 1, wherein the probe card comprises at least one capacitor disposed on the first surface of the membrane and located outside the pushed area, and the body further has a pocket located on one side of the pushing part.

3. The plunger as claimed in claim 1, wherein the probe card comprises at least one capacitor disposed on the first surface of the membrane and located in the pushed area, and the body further has a pocket located on a top end of the pushing part.

4. The plunger as claimed in claim 1, wherein the circuit layer is suitable for contacting and being connected to the circuit board.

5. The plunger as claimed in claim 1, wherein the circuit board is suitable for contacting and being connected to the conductive layer located on the base part.

6. The plunger as claimed in claim 1, wherein the circuit layer is suitable for contacting and being connected to part of the conductive layer located on the base part.

7. The plunger as claimed in claim 1, wherein the probe card comprises at least one capacitor disposed on the first surface of the membrane.

* * * * *